United States Patent [19]
Chiao et al.

[11] Patent Number: 6,088,235
[45] Date of Patent: Jul. 11, 2000

[54] EMI NOISE CANCELLATION IN DISK DRIVE HAVING MR READ HEAD AND SINGLE-ENDED PREAMPLIFIER

[75] Inventors: James Chiao, Saratoga; Gary G. Kinoshita, San Jose, both of Calif.

[73] Assignee: Quantum Corporation, Milpitas, Calif.

[21] Appl. No.: 08/962,923

[22] Filed: Oct. 27, 1997

[51] Int. Cl.$^7$ ........................................ H05K 1/11
[52] U.S. Cl. .................. 361/777; 361/683; 361/684; 361/686; 333/12; 366/98.01; 174/117 FF
[58] Field of Search ...................... 361/777, 818, 361/820, 748, 749, 683–686, 782; 333/12, 246, 247; 360/98.01, 103–106; 174/117 FF

[56] References Cited

U.S. PATENT DOCUMENTS

| | | | |
|---|---|---|---|
| 5,055,969 | 10/1991 | Putnam | 361/749 |
| 5,165,055 | 11/1992 | Metsler | 333/12 |
| 5,204,789 | 4/1993 | Jove et al. | 360/67 |
| 5,270,882 | 12/1993 | Jove et al. | 360/67 |
| 5,389,735 | 2/1995 | Bockelman | 174/33 |
| 5,499,161 | 3/1996 | Hosseinzadeh et al. | 361/749 |
| 5,587,692 | 12/1996 | Graham et al. | 333/12 |
| 5,644,452 | 7/1997 | Cox et al. | 360/106 |
| 5,677,811 | 10/1997 | Kuno et al. | 360/97.01 |
| 5,761,049 | 6/1998 | Yoshidome et al. | 361/782 |
| 5,768,070 | 6/1998 | Krounbe et al. | 360/113 |
| 5,930,072 | 7/1999 | Shrinkle | 360/97.01 |

*Primary Examiner*—Leo P. Picard
*Assistant Examiner*—David Foster
*Attorney, Agent, or Firm*—David B. Harrison; Henry J. Groth

[57] ABSTRACT

Magnetic noise cancellation in a single-ended MR preamplifier front end is achieved by forming a balanced ground return path in a flex circuit connecting an MR head to the front end of the preamplifier. The balanced ground return path introduces a noise current in the opposite direction of the original noise current as viewed at the signal input pins of the preamplifier chip. In this manner common mode rejection of the radiated noise component is restored in the single-ended MR preamplifier circuit arrangement.

4 Claims, 7 Drawing Sheets

```
Preamp              Flex Ckt

Gnd    ─────────────────────────────┐
H5Rx   ───────── S_pad ──────────── Gnd_pad
H4Rx   ───────── S_pad ──────────── Gnd_pad
H3Rx   ───────── S_pad ──────────── Gnd_pad
Gnd    ─────────────────────────────┘

Gnd    ─────────────────────────────┐
H2Rx   ───────── S_pad ──────────── Gnd_pad
H1Rx   ───────── S_pad ──────────── Gnd_pad
H0Rx   ───────── S_pad ──────────── Gnd_pad
Gnd    ─────────────────────────────┘
```

*FIG. 9*    19

EMI NOISE CANCELLATION IN DISK DRIVE HAVING MR READ HEAD AND SINGLE-ENDED PREAMPLIFIER

FIELD OF THE INVENTION

This invention relates generally to structure and method for reducing electromagnetic noise pickup. More particularly, the present invention relates to apparatus for canceling magnetically coupled noise otherwise induced in a flex circuit of a single-ended MR preamplifier of a hard disk drive.

BACKGROUND OF THE INVENTION

Contemporary magnetic disk drives typically include a rotating rigid storage disk and a head positioner for positioning a sensitive data transducer at different radial locations relative to the axis of rotation of the disk. Each location followed by the transducer defines a concentric data storage track on each recording surface of the disk. The read/write transducer, which may be of a single or dual element design, is typically deposited upon a ceramic slider structure having a highly polished air bearing surface for supporting the to transducer at a very small distance away from the surface of the moving disk storage medium.

Single write/read inductive element designs have typically required two wire connections, while dual element designs having separate reader and writer elements require four wire connections. Magnetoresistive (MR) heads in particular generally require four connection paths. The combination of an air bearing slider and a read/write transducer is also known as a read/write head or a recording head.

A head select, write driver, read preamplifier integrated circuit is physically located as close as practical to the read element to reduce pickup of unwanted electromagnetic noise. In the past, single element read/write electromagnetic transducers have been coupled to the read preamplifier via minute twisted wires dressed along the head positioner structure. More recently, printed circuit techniques employing linear parallel traces have been adopted to provide more control and uniformity in the connection path between the head and the preamplifier. These techniques have employed a trace suspension array (TSA) which provides a dual function of connecting the head and suspending the head over the disk by forming a gimbal enabling the head to pitch and roll to conform with the disk surface during flight. The TSA has then connected to a flexible trace interconnect (FIC) which then extends the signal paths from the head suspension to a printed circuit, called a "flex circuit" typically mounted on the head positioner structure.

Disk drive performance may be degraded by a particular operating or use environment. The disk drive designer and manufacturer who does not also assemble and integrate the disk drive into a completed computing system has virtually no control over the ultimate operating environment, and must take preventative and sometimes remedial steps to reduce electromagnetic noise interference. It has been learned through careful measurements that degradation of drive performance from EMI comes mainly from electromagnetic noise radiated externally of the drive which is picked up by an external cable connecting the drive to the computing system. The cable acts as an antenna and couples the externally sourced EMI into the drive and particularly into the sensitive front-end head signal preamplification circuitry of the drive. In particular, placement of the disk drive in close proximity to a magnetically noisy appliance, such as a compact disk (CD) player, within a computer housing, and/or the close proximity of cabling leading to such appliance to disk drive cabling, has led to unwanted coupling of electromagnetic noise.

Previously, the head preamplifier circuit has operated as a balanced input differential amplifier. The arrangement of the twisted wire pair and the balanced differential input has worked well to cancel and suppress interference appearing on each signal input line. Usually, the read preamplifier is not sensitive to a common signal on both of its differential signal inputs. Thus, the output voltage change due to a common input signal will approach zero. This common input signal or interference is known as "common mode" noise. Front end noise rejection has been measured by a common mode rejection ratio at the read preamplifier which is usually defined as a ratio of common-mode gain to differential signal gain of the preamplifier.

With the proliferation of separate MR read elements other concerns have arisen. First, the MR read element, essentially comprising a resistor formed of a very thin film of high permeability ferromagnetic conductive material, such as certain nickel iron alloys, e.g. Permalloy™, is highly susceptible to electrostatic damage. Therefore, it is important that the MR element be maintained at the same potential as the disk, so that if the MR element comes into electrical contact with the disk, the MR element will not be damaged by a potential difference. In practice, this requirement means that one signal path from the MR read element is grounded, and further means that the read preamplifier is operated in a single-ended configuration and loses the EMI noise cancellation advantages of the differential input arrangement. Also, as supply voltages are reduced from 12 volts, to 5 volts and more recently to 3.3 volts, there is simply insufficient voltage headroom to operate the read preamplifier in a differential input amplification mode.

EMI noise can be reduced by adding shielding to shield the front end of the disk drive. One example of shielding is provided by U.S. Pat. No. 5,270,882 to Jove et al., entitled: "Low-Voltage, Low-Power Amplifier for a Magnetoresistive Sensor", the disclosure thereof being incorporated herein by reference. The Jove et al. solution described in this prior patent was to enclose completely the head and disk assembly within a highly conductive, electrostatically shielded metallic enclosure. The enclosure essentially provided a Faraday cage which isolated the signal leads connecting the MR read elements with the preamplifier circuit from large, fast rise/fall time voltage transients. Selective shielding of sensitive components at the front end also has worked to isolate these components from unwanted pickup of magnetically coupled noise. Ferromagnetic tapes and bands have also been added to shield electrical gaps formed by a gasket between a cover and base of a disk drive. However, these prior techniques add complexity and expense to the drive. Thus, a hitherto unsolved need has remained for a simpler, less expensive way to reduce electromagnetic noise pickup and interference at the front end of a read channel of a magnetic storage device employing a single-ended preamplifier.

SUMMARY OF THE INVENTION WITH OBJECTS

A general object of the present invention is to improve the performance of a storage device by reducing pickup of magnetically coupled, unwanted electrical noise.

A more specific object of the present invention is to achieve noise cancellation at the front end of a single-ended signal preamplifier stage of a storage device by adding a balanced ground return path which picks up a noise current in an opposite direction of an original noise current otherwise induced in the ground return path.

Yet another specific object of the present invention is to provide two ground loops at the front end of a preamplifier chip such that common mode noise fields induce equal and opposite currents in the two loops, thereby canceling this common mode noise at the preamplifier input.

In one aspect of the present invention a magnetic storage device includes a base forming a ground return path, and a positive supply voltage node. At least one data magnetic storage medium on which data is stored is moved relative to the base. At least one magnetoresistive (MR) sensing element senses the data recorded on the storage medium. The MR sensing element is connected to a signal connection and the ground return path. A single-ended bias/amplifier circuit is connected to the signal connection for biasing the MR sensing element with a bias current with respect to the ground return path and for amplifying the data sensed by the MR sensing element. An interconnection path is provided between the MR sensing element and the single-ended bias/amplifier circuit which includes plural loop paths for canceling common mode EMI otherwise present at an input of the single-ended bias/amplifier circuit. In this aspect of the invention the loop paths comprise balanced ground return paths as seen at a signal input of the single-ended bias/amplifier circuit.

In another aspect of the present invention a flexible circuit assembly is provided for a mass storage device such as a magnetic hard disk drive. The flexible circuit assembly includes an insulative substrate of a flexible plastic film carrying a defined pattern of conductive traces. An integrated circuit mounting region is defined by the substrate as a pattern of connection pads aligned to be connected to pins of the integrated circuit by an electrical bonding agent, such as solder. The pins include a single-ended preamplifier signal input pin and at least two ground pins. The pattern of conductive traces includes a signal path extending from a trace pad aligned with the preamplifier signal input pin to a distal signal input connection pad for connecting to a head and a plurality of ground return paths leading from a vicinity of the distal signal input connection pad to the at least two ground pins. The plurality of ground return paths are so arranged that a common mode interference induces noise currents in opposite directions in the ground return paths. The noise currents are therefore combined and canceled at a preamplifier connected to the preamplifier signal input pin within the integrated circuit.

These and other objects, advantages, aspects, and features of the present invention will be more fully appreciated and understood upon consideration of the following detailed description of preferred embodiments presented in conjunction with the accompanying drawings.

BRIEF DESCRIPTION OF THE DRAWINGS

In the Drawings

FIG. 9 is a simplified circuit model showing application of the FIG. 7 principles to a hard disk drive having six data surfaces and six MR read head elements.

DETAILED DESCRIPTION OF PREFERRED EMBODIMENTS

Figure 1:
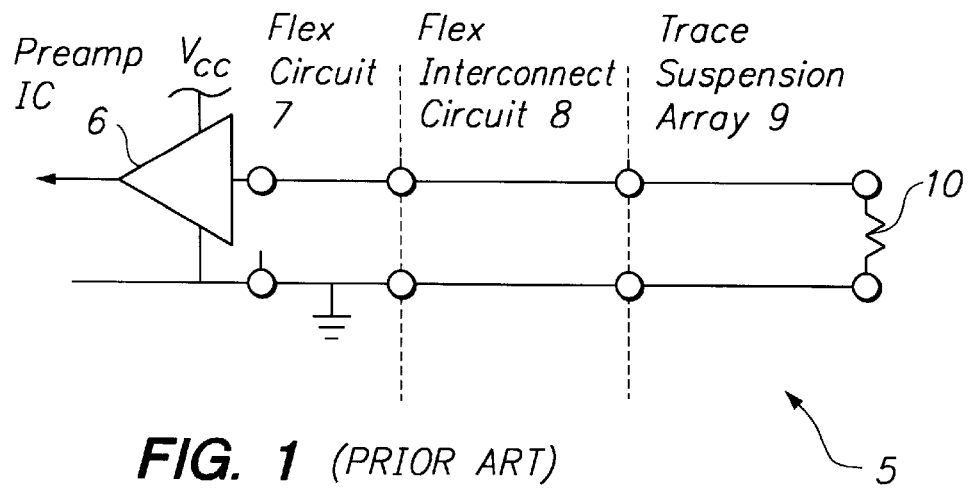
FIG. 1 is a simplified schematic circuit diagram showing an electromagnetic noise pick-up loop present in prior art hard disk drive designs.

With reference to FIG. 1 a front end circuit loop 5 is formed at the input of a preamplifier 6. The front end circuit loop 5 comprises a signal path which starts at the preamplifier's reader input (HnRx pin) and ends at the MR element ground return (Gnd pin) of the preamp 6. The loop 5 also includes signal and return traces of a flex circuit 7, a flex interconnect circuit (FIC) 8, a trace suspension assembly (TSA) 9, and an MR head element 10. The small circles in FIG. 1 between the various elements 6, 7, 8, 9 and 10 denote points of interconnect. For example, the read preamplifier integrated circuit (IC) may be a four channel MR read/write preamplifier chip such as type TLS24E774PT, or a six channel MR read/write preamplifier chip such as type TLS24E776PT, both supplied as standard component parts by Texas Instruments, Inc. This part is contained in a 48 pin TQFP package, 12 pins per edge, and is more particularly described in a preliminary specification Rev 0.3 dated May 1997, reference to which is made for further particulars. Besides the read preamplifier 6, the IC chip includes head select, write driver, MR element bias and certain other control circuits and features.

Figure 12:
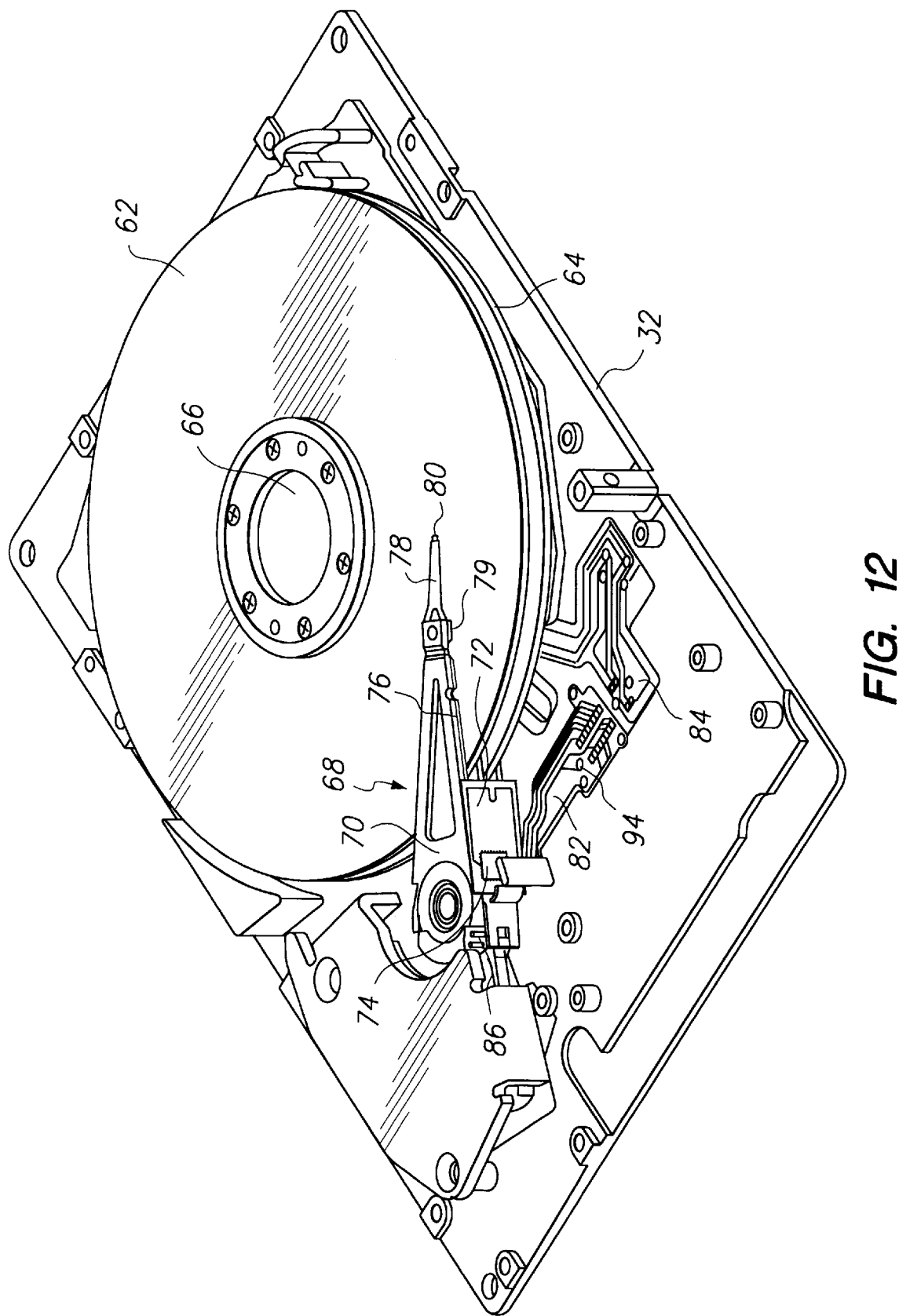
FIG. 12 is a more detailed isometric view of the FIG. 10 disk drive with the top cover and the main electronics circuit board removed to show a flex circuit incorporating principles of the present invention.
Figure 13:
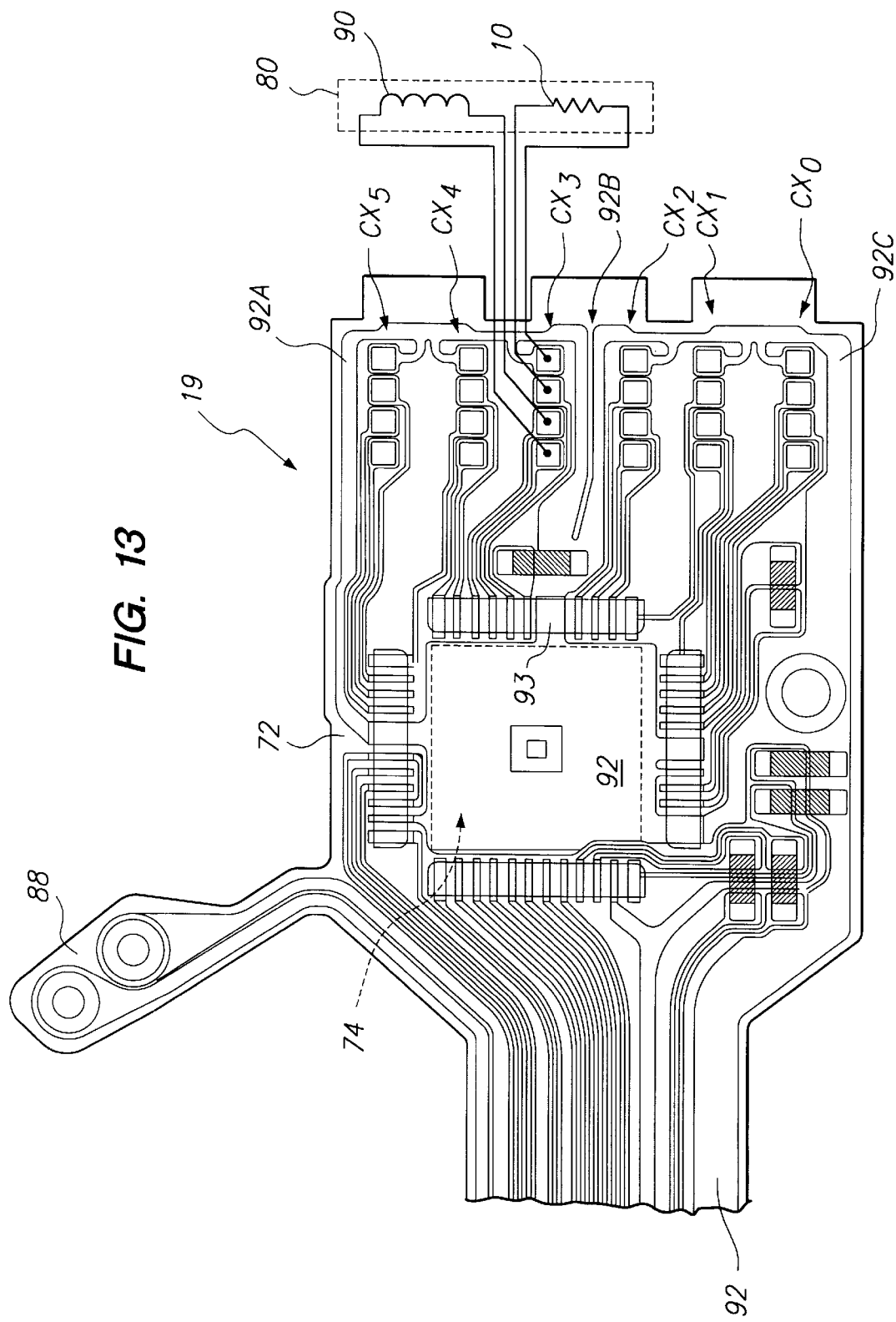
FIG. 13 is an enlarged, detailed view of a flex circuit of the FIG. 12 disk drive which incorporates principles of the present invention.

The FIC 8 comprises a small elongate strip of polyamide upon which e.g. four minute conductor traces are deposited in a parallel arrangement. The TSA 9 is formed as part of a load beam or spring which biases the head including MR element 10 toward the disk surface. An example of a TSA within a hard disk drive operating environment is described in U.S. Pat. No. 5,717,547, for "Multi-Trace Transmission Lines for Read/Write Head Interconnect in Hard Disk Drive", the disclosure thereof being incorporated herein by reference. A practical,flex circuit 72 incorporating principles of the present invention is illustrated in FIG. 12 and FIG. 13 hereof and discussed below.

In the FIG. 1 circuit any radiated noise picked up by the front end circuit loop 5 can severely degrade the signal-to-noise ratio (SNR) of the preamplifier 6 and consequently reduce overall performance of the drive. The circuit traces on the FIC 8 and the TSA 9 are narrow, and they are closely spaced apart from each other to save space. Consequently, a majority of the conductor area of the front end circuit loop 5 comprises the ground and signal traces layout of the flex circuit 7. In a typical flex circuit layout, such as diagrammed schematically in FIG. 1, a common MR ground return path is provided to a ground of the preamp 6. In such a circuit having multiple MR elements as is the usual practice, the loop conductor area varies from MR element to MR element, depending upon the distance between the MR element signal trace and the MR element ground return path. Usually, the MR element(s) which is farthest away from the common ground return manifests the worst performance. Also, the conductor trace areas and volumes are much larger in the flex circuit than in the FIC/TSA structures. Thus, it has been found that in hard disk drives employing FIC/TSA interconnect structures, flex circuit layout could be a dominant factor in EMI noise pickup.

Figure 2:
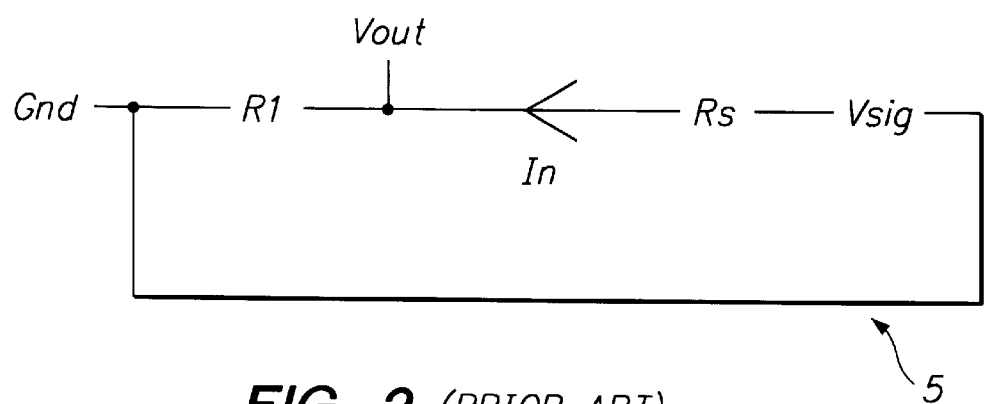
FIG. 2 is a simplified circuit model of the FIG. 1 circuit.

The FIG. 1 front end circuit loop 5 can be simplified to a generalized single-ended circuit model as shown in FIG. 2. In the FIG. 2 generalization Vsig is the head voltage, Rs is the head resistance, and R1 is the input impedance of the preamplifier 6. Because the FIG. 2 loop model is single-ended, there is no rejection of common mode magnetic noise induced from extraneous noise fields. Any noise current In flowing in the loop 5 can cause a noise voltage $V_n$ which is equal to R1·In at Vout.

$$Is = Vsig/(Rs + R1)$$
$$Vout = Is \cdot R1 + Vn, \text{ or}$$
$$Vout = Is \cdot R1 + In \cdot R1.$$

Figure 3:
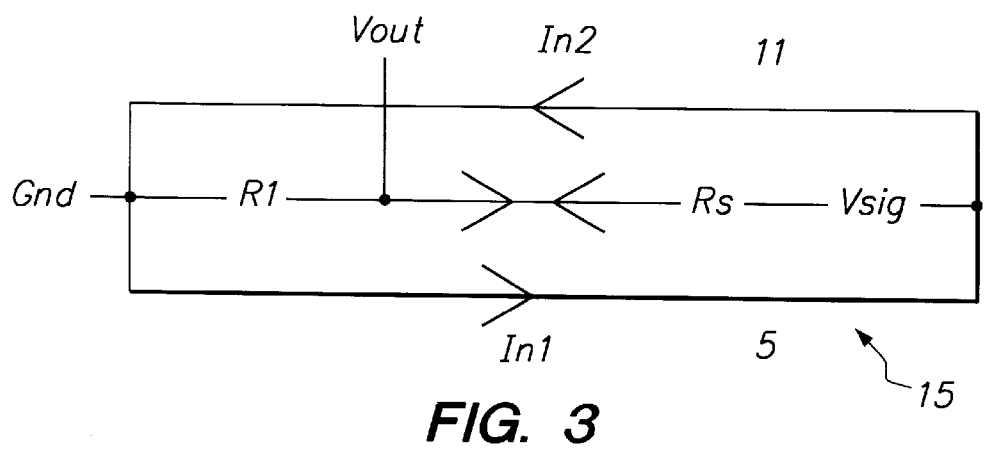
FIG. 3 is a simplified circuit model providing noise cancellation in accordance with principles of the present invention.

One way to achieve common mode rejection of the magnetically coupled noise current In is to introduce another loop wherein the noise current In flows in an opposite direction at the preamp input R1. In accordance with principles of the present invention, this result may be achieved by providing a separate ground return loop 11 which is on an opposite side of the main loop 5, as shown diagrammatically in FIG. 3. In the FIG. 3 dual ground loop circuit 15, the signal source Vsig (MR read element 10) produces the signal current Is, and the total voltage developed over the load Vout is as follows:

$$Vout = Is \cdot R1 + Vn, \text{ or}$$
$$Vout = Is \cdot R1 + (In1 - In2) \cdot R1,$$

where

In1 is the noise current induced in the main front end loop 5 and In2 is the noise current induced in the second loop 11. If the FIG. 3 circuit 15 is made to be balanced such that In1 is equal to In2, then the resultant noise voltage at Vout is:

$$Vn = R1 \cdot (In1 - In2) = 0, \text{ and}$$
$$Vout = Is \cdot R1.$$

In other words, the noise disturbance field induces noise currents In1 and In2 in loops 5 and 11 which are of equal magnitude and opposite directions, and which cancel each other at the loop output Vout.

Figure 4:
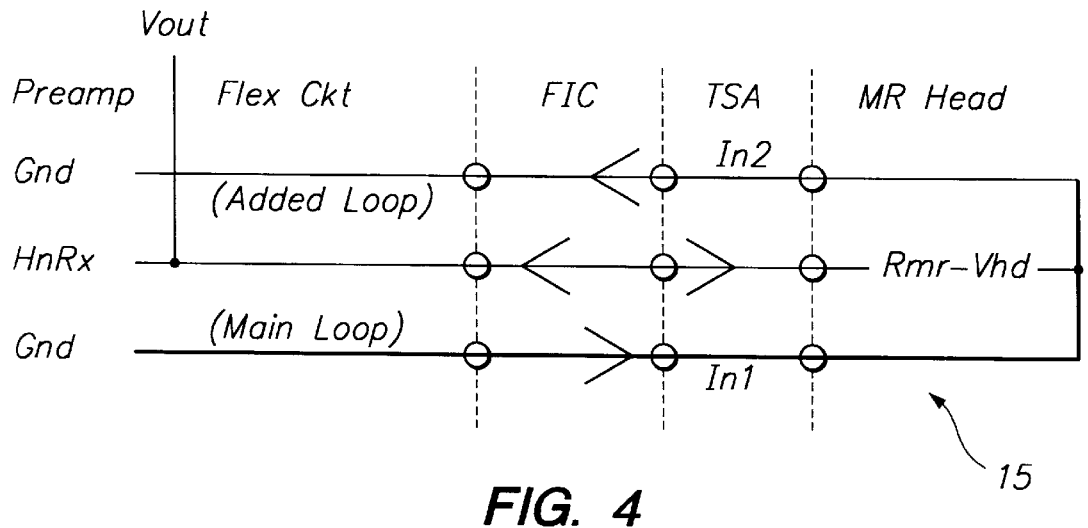
FIG. 4 is a simplified circuit model for a magnetoresistive read head front end of a hard disk drive incorporating the FIG. 3 principles.
Figure 5:
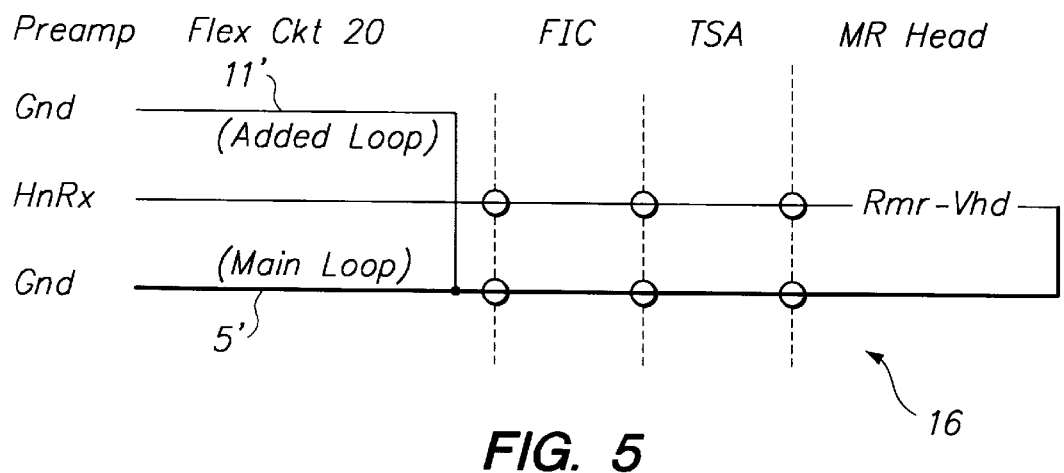
FIG. 5 is a simplified circuit model showing application of the FIG. 4 principles to a flex circuit element of the FIG. 4 circuit, further in accordance with principles of the present invention.

An equivalent noise cancellation circuit can be applied to an MR preamp front end, as shown in FIG. 4, where HnRx is one of the head signal pins of the preamplifier chip 6 (as shown in FIG. 1.). The grounds Gnd are tied together at the preamplifier chip ground. Since the conventional flex circuit 7 (shown in FIG. 1) has been determined to be the main cause of noise pickup, the FIG. 4 circuit may be implemented within a new flex circuit 20 for a given head signal HnRx as shown in FIG. 5. In this new front end circuit arrangement 16, the flex circuit 20 is made to have two ground path return loops, namely a main loop 5' and an added loop 11'.

Figure 6:
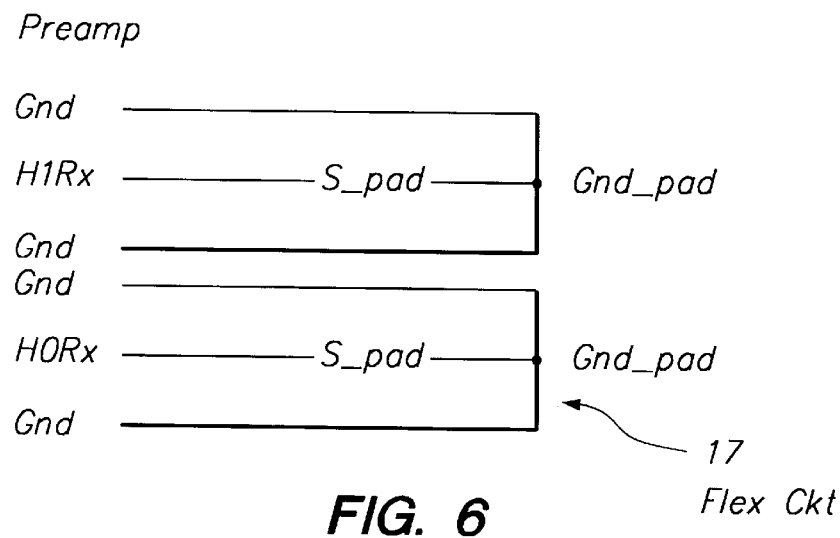
FIG. 6 is a simplified circuit model extending the FIG. 5 principles to a flex circuit supporting one storage disk having two data surfaces and MR read head elements.

FIG. 6 presents a simplified schematic diagram of a flex circuit 17 supporting connection of two MR read element signal paths H0 and H1 via signal pads S_pad and ground pads Gnd_pad. This circuit 17 is particularly useful in single platter disk drives wherein a separate head with MR read element is provided for the two major data storage surfaces of the single disk. However, in order to use a standard MR preamplifier part 6 with a predetermined pin-out arrangement, such as the Texas Instruments part described and referenced above, it may not be possible to provide a separate ground loop for each head signal H0Rx and H1Rx. In such case, a modified flex circuit layout may be realized to provide separate balanced ground loop return paths for multiple head signals.

Figure 7:
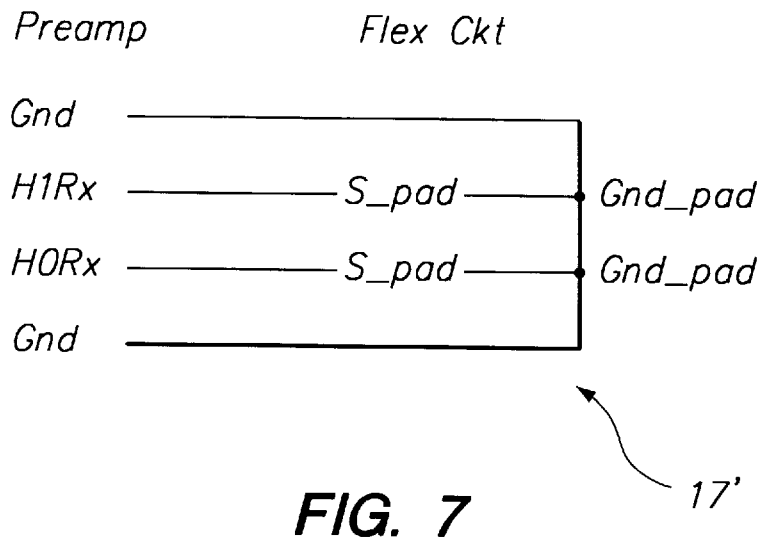
FIG. 7 is a simplified circuit model illustrating an alternative implementation of the FIG. 6 circuit model supporting a disk drive having two data surfaces and MR read head elements.
Figure 8:
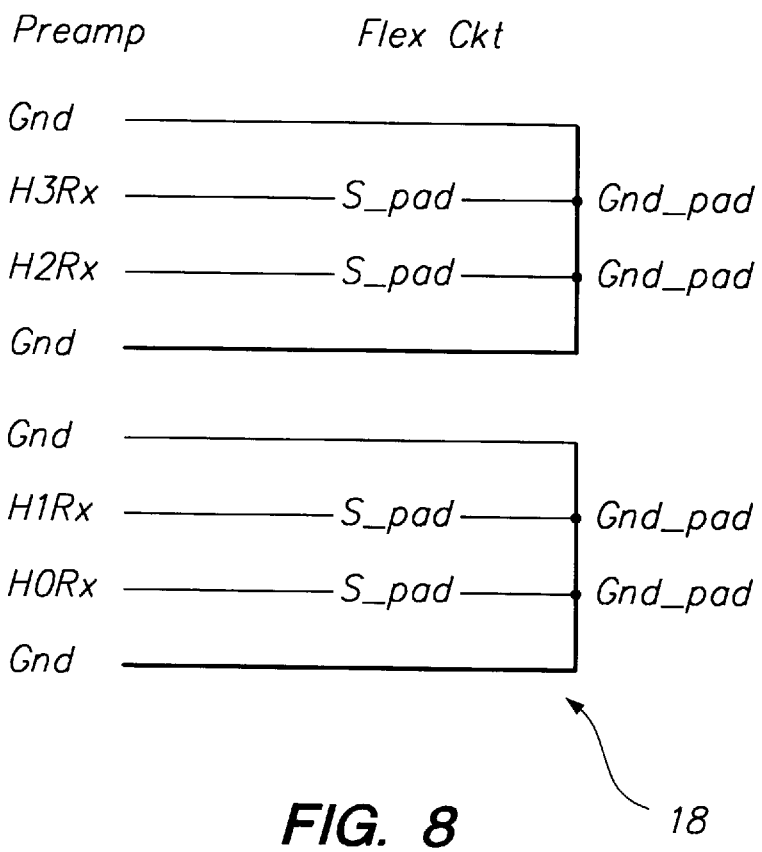
FIG. 8 is a simplified circuit model showing application of the FIG. 7 principles to a hard disk drive having four data surfaces and four MR read head elements.

In FIG. 7 a balanced ground loop arrangement 17' supports a single disk, two MR head disk drive architecture. In FIG. 8, four heads and two disks are supported in a balanced ground loop arrangement 18. And, in FIG. 9, six heads and three disks are supported in a balanced ground loop arrangement 19.

Figure 10:
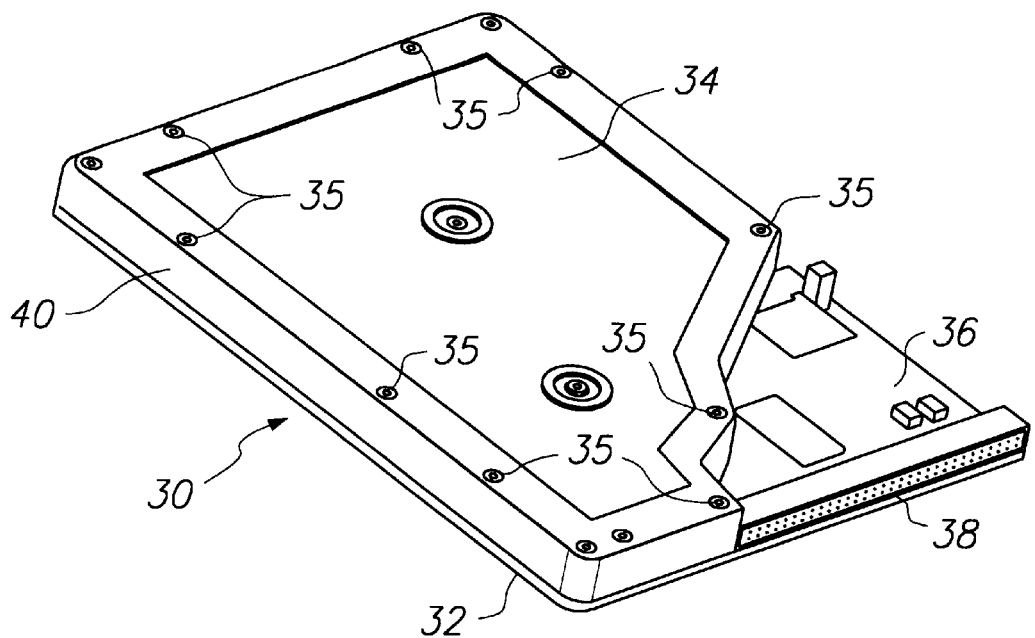
FIG. 10 is an isometric view of a two-disk hard disk drive having a flex circuit incorporating the principles of the present invention as implemented in the FIG. 8 preferred embodiment.

FIG. 10 presents a diagrammatic view of a hard disk drive 30 incorporating principles of the present invention. As shown in FIG. 10, the disk drive 30 includes e.g. a flat base 32, a "deep-dish" cover 34 and triangularly-shaped printed circuit board 36 disposed at one corner of the base not occupied by the cover 34 and carrying the integrated drive electronics. The circuit board 36 includes a jack array 38 enabling power and data connections to be made with an external computing environment, such as a desk-top computer 50 shown with its cover removed in FIG. 11. Further details of a suitable PCB-flex circuit interconnection arrangement are given in commonly assigned, copending U.S. patent application Ser. No. 08/876,115 filed on Jun. 13, 1997, for "Low Profile Disk Drive Architecture with In-Line Circuit Board and Flex Circuit Pressure Connector", now U.S. Pat. No. abandoned, the disclosure thereof being incorporated herein by reference.

Returning to FIG. 10, a gasket 40 of non-conductive elastomeric material is placed between a peripheral edge of the cover 34 and a facing peripheral portion of the base 32, and thereby seals an interior space including one to three storage disks, and an actuator structure against contamination by minute particulates, etc., as is required of flying head or "Winchester" hard disk drive technology. The cover 34 is electrically grounded to the base 32 by one or more of plural cover screws 35.

Figure 11:
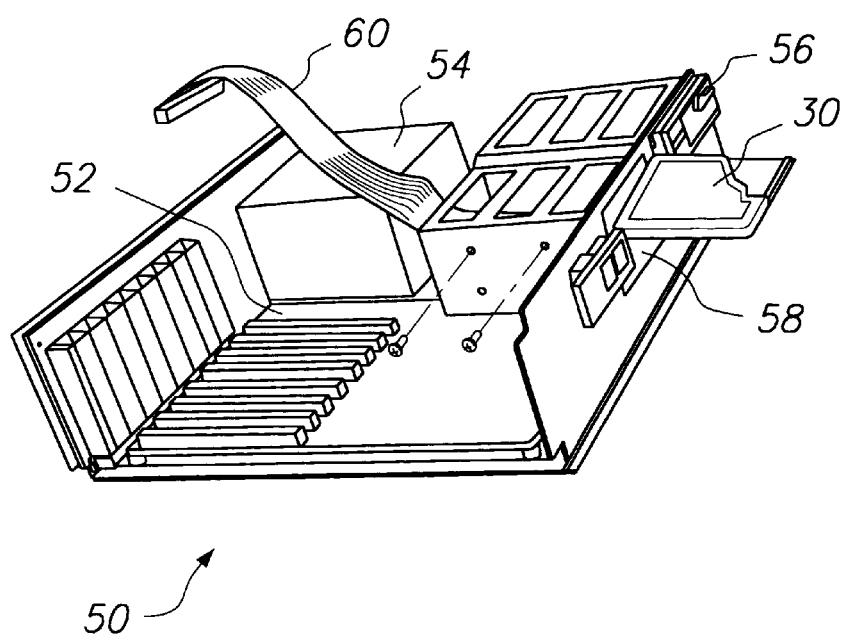
FIG. 11 is a view in perspective of a desk top computer incorporating the FIG. 10 hard disk drive and illustrating multiple sources of electromagnetic noise overcome in accordance with principles of the present invention.

Now turning to FIG. 11, the desk-top computer 50 conventionally includes a mother board 52 containing a central processor unit chip (CPU), a switching power supply 54, a floppy disk drive 56, and a CD ROM optical disk drive 58 in addition to the hard disk drive 30, shown in an installation position. A data cable 60 includes a plug at each end, one for mating with the jack array 38 and the other for mating with a jack extending from the mother board, or in earlier computers from a peripheral expansion card supporting hard drive interconnection to the mother board 52. It has been determined by the present inventors that the data cable 60 functions as an antenna which radiates the unwanted EMI noise fields which reach the MR front end loop. In one particular case, the CD ROM optical drive of a particular computer make was found to radiate a continuous wave signal at 35 MHz, a frequency lying well within the signaling bandwidth of the front end loop of the hard disk drive. Until the present invention was included in the disk drive 30, the 35 MHz interference wave severely degraded disk drive performance.

Turning now to FIG. 12, the disk drive 30 is shown as including two storage disks 62 and 64 mounted to a common spindle 66. A rotary voice coil actuator structure 68 has an actuator rotor body 70 having a side supporting a flex circuit 72 in accordance with principles of the present invention. The flex circuit 72 supports and connects an integrated circuit chip 74, such as the Texas Instruments' TLS 24E774PT described above. A FIC 76 extends along each of two outer head arms of the actuator rotor body 70 each supporting one head suspension, and two FICs 76 extend along a central head arm supporting two head suspensions. Each head suspension includes a TSA 78 and a read/write head 80 including a MR read element 10 (as shown in FIG. 13). Returning to FIG. 12, the TSA 78 of each suspension connects to the MR read and thin film inductive write elements of the head 80. These elements are formed by metal deposition processes on a trailing edge of a slider body forming the head 80.

The flex circuit 72 includes an extension 82 lying on an upper wall of the base 32 and presenting an array of connection pads. Another flexible circuit 84 includes an array of connection pads aligned with the array of the extension 82, such that a single pressure pin connector of the circuit board 36 may establish electrical connections to the pad arrays of circuits 82 and 84 when the circuit board 36 is installed and clamped by screws to the base 32 in the position shown in FIG. 10.

The actuator 68 includes a voice coil to which connection is made by the flex circuit 72 at connector pins 86. The voice coil rotates in a gap between two powerful permanent magnets such that current passing through the voice coil causes a rotational force to be imparted to the rotor body 70 in accordance with current direction in the voice coil.

Turning now to FIG. 13, a greatly enlarged plan view is presented of the flex circuit portion 72 shown mounted along a side of the actuator rotor body 70 in the FIG. 12 view. The flex circuit 72 physically tracks the three-disk, six head flex circuit arrangement 19 shown in FIG. 9, and implements principles of the present invention. An extension 88 of the flex circuit 72 provides an electrical path to the actuator coil connector pins 86. The six-channel preamplifier chip 74 (e.g. Texas Instruments' type TLS24E776PT) is shown in phantom outline by the dashed box superimposed on the flex circuit 72 illustrated in FIG. 13.

The flex circuit 72 includes a major trace portion defining a ground plane 92 which underlies the chip 74 and which extends to a grounding location 94 at which the wide flex circuit ground trace is electrically grounded to the base 32, as shown in FIG. 12. As shown in FIG. 13, the flex circuit 72 provides 48 connection pads for connecting to the 48 package terminals of the preamplifier chip 74, twelve connections per side. Three ground connections of the ground trace 92 have two-terminal width to provide lower resistance grounding to the circuitry of the chip 74. There are six terminal arrays on the right side of the flex circuit 72 in the FIG. 13 view: CX0, CX1, CX2, CX3, CX4 and CX5. The right-most pad of each array CX is a ground connection for connecting to one side of a magnetoresistive read element 10, one such element of the six present being graphed schematically in FIG. 13. The pad next to each ground pad of each array CX comprises a signal pad Rx for the MR read element 10. The other two pads extend to a thin film write element 90 within each head assembly 80.

Connections are made to each pad array CX by a flex circuit connecting end portion of an FIC 8. A TSA connecting end of the FIC 8 connects to a pad array of the TSA at a connecting location 79 adjacent a load beam swage plate which is swage-connected to the distal end of each head arm, as shown in FIG. 12. In turn, the TSA connects to connecting pads formed on the slider of the head 80.

In accordance with principles of the present invention, the ground trace 92 is divided into two loops at the connecting pad regions CX. A main ground loop 92C serves connecting pad arrays CX0, CX1 and CX2, while a second ground loop 92A serves connecting pad arrays CX3, CX4 and CX5. A gap denoted by reference numeral 92B is etched or otherwise defined between the two ground trace regions 92A and 92C, the gap extending from beyond each ground pad of the arrays CX to a region adjacent to a signal ground terminal location 93 of the chip 74. This elegant, inexpensive modification to flex circuit 72 has proven to provide surprisingly high amount of common mode rejection otherwise not available in the single-ended loop arrangements previously implemented in the prior art approaches.

Tests performed on disk drives having flex circuits with and without the gap 92B have shown that a 6.5 dB improvement in common mode noise rejection was realized as an average for all heads, and that for some heads the improvement approached 10.8 dB. Accordingly, noise cancellation is achieved by adding a balanced ground return path at the front end of the flex circuit 72 which introduces a noise current in the opposite direction of the original noise current as viewed at the signal input pins of the preamplifier chip 74. In this manner common mode rejection of the radiated noise component is restored at the front end of the single-ended MR preamplifier 74.

Having thus described embodiments of the invention, it will now be appreciated that the objects of the invention have been fully achieved, and it will be understood by those skilled in the art that many changes in construction and widely differing embodiments and applications of the invention will suggest themselves without departing from the spirit and scope of the invention as more particularly defined by the following claims. The disclosure and the description herein are purely illustrative and are not intended to be in any sense limiting.

What is claimed is:

1. A circuit assembly for a mass storage device comprising:

an insulative substrate carrying a patterned array of conductive traces, an integrated circuit mounting region defined by the substrate as a pattern of connection pads aligned to be connected to pins of an integrated circuit, the pins including a single-ended preamplifier signal input pin and at least two ground pins, the patterned array of conductive traces including:

a signal path extending from a trace pad aligned with the preamplifier signal input pin to a distal signal input connection pad, and a plurality of loops, the loops including corresponding ground return paths and the signal path, each of the corresponding ground return paths leading from a vicinity of the distal signal input connection pad to the at least two ground pins, the ground return paths including:

a first ground return path combined with the signal path to form a first loop having a first position relative to a single-ended preamplifier, and a second ground return path combined with the signal path to form a second loop having a second position relative to the single-ended preamplifier approximately opposite the first position, and wherein the first loop and the second loop are arranged so that a common mode interference induces noise currents in approximately opposite directions in the first loop and the second loop, the noise currents becoming approximately canceled at the single-ended preamplifier signal input pin.

2. A circuit assembly for a mass storage device comprising:

an insulative substrate including a flexible plastic film, the insulative substrate carrying a patterned array of conductive traces, an integrated circuit mounting region defined by the substrate as a pattern of connection pads aligned to be connected to pins of an integrated circuit by electrical bonding means, the pins including a single-ended preamplifier signal input pin and at least two ground pins, the patterned array of conductive traces including:

a signal path extending from a trace pad aligned with the preamplifier signal input pin to a distal signal input connection pad, and a plurality of ground return paths leading from a vicinity of the distal signal input connection pad to the at least two ground pins, the signal path combining with a first ground path to form a first loop and combining with a second ground path to form a second loop, the first loop and the second loop arranged to cancel common mode interference inducing noise currents in approximately opposite directions in the loops, the noise currents becoming approximately canceled at the single-ended preamplifier connected to the single-ended preamplifier signal input pin within the integrated circuit.

3. The disk drive set forth in claim 2 further comprising at least one circuit array for connecting the single-ended bias/amplifier circuit to the MR sensing element via the signal connection and for defining the balanced ground return path at the signal input of the single-ended bias/amplifier circuit.

4. The disk drive set forth in claim 3 wherein the at least one circuit array comprises a flex circuit mounted to a major surface wall of the base.

* * * * *